United States Patent
Kim et al.

(10) Patent No.: US 9,054,010 B2
(45) Date of Patent: Jun. 9, 2015

(54) LARGE-SCALE X-RAY DETECTORS

(75) Inventors: Sang-wook Kim, Yongin-si (KR); Chang-jung Kim, Yongin-si (KR); Jae-chul Park, Suwon-si (KR); Sun-il Kim, Osan-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 682 days.

(21) Appl. No.: 13/212,759

(22) Filed: Aug. 18, 2011

(65) Prior Publication Data
US 2012/0223241 A1 Sep. 6, 2012

(30) Foreign Application Priority Data

Mar. 4, 2011 (KR) .................. 10-2011-0019646

(51) Int. Cl.
*H01L 27/146* (2006.01)
(52) U.S. Cl.
CPC .... *H01L 27/14676* (2013.01); *H01L 27/14618* (2013.01)
(58) Field of Classification Search
USPC ....................................... 250/370.09, 370.13
See application file for complete search history.

(56) References Cited

U.S. PATENT DOCUMENTS

| | | | |
|---|---|---|---|
| 6,510,195 B1 | 1/2003 | Chappo et al. | |
| 7,189,971 B2 | 3/2007 | Spartiotis et al. | |
| 2003/0155516 A1 | 8/2003 | Spartiotis et al. | |
| 2006/0192087 A1* | 8/2006 | Kuszpet et al. | 250/214 R |
| 2011/0071397 A1* | 3/2011 | Wodnicki et al. | 600/459 |

FOREIGN PATENT DOCUMENTS

| | | |
|---|---|---|
| JP | 2003133654 A | 5/2003 |
| KR | 19990077326 | 10/1999 |
| KR | 100647212 | 11/2006 |

OTHER PUBLICATIONS

HyperBGA® Data Sheet (2010), 2 pages.*
Abstract of WO 97/26677 published Jul. 24, 1997.
Abstract of WO 2004/097938 published Nov. 11, 2004.

* cited by examiner

*Primary Examiner* — David Porta
*Assistant Examiner* — Shun Lee
(74) *Attorney, Agent, or Firm* — Harness, Dickey & Pierce, P.L.C.

(57) ABSTRACT

An X-ray detector including a plurality of chips on a printed circuit board, each of the plurality of chips including a plurality of pixel pads on a center portion of the printed circuit board and a plurality of pin pads surrounding the plurality of pixel pads, a plurality of pixel electrodes on and corresponding to the plurality of chips, a redistribution layer electrically connecting the plurality of pixel electrodes and the plurality of pixel pads, a plurality of first electrode pads on a surface opposite to a surface of the plurality of chips including the plurality of pin pads, a wire electrically connecting the plurality of first electrode pads and the plurality of pin pads, a photoconductor on the plurality of pixel electrodes, and a common electrode on the photoconductor.

17 Claims, 3 Drawing Sheets

LARGE-SCALE X-RAY DETECTORS

CROSS-REFERENCE TO RELATED APPLICATIONS

This application claims priority under 35 U.S.C. §119 to Korean Patent Application No. 10-2011-0019646, filed on Mar. 4, 2011, in the Korean Intellectual Property Office (KIPO), the entire contents of which is incorporated herein by reference.

BACKGROUND

1. Field

Example embodiments relate to large-scale X-ray detectors that may realize seamless images.

2. Description of the Related Art

A digital X-ray detector outputs an X-ray image photograph or an X-ray fluoroscopic image using an X-ray in form of digital signals. An X-ray detector may be a direct type and/or an indirect type. According to the direct type, a photoconductor directly converts an X-ray to electric charges. In the indirect type, a scintillator converts an X-ray to a visible ray and a photoelectric conversion device such as a photodiode converts a converted visible ray to electric charges.

A direct type X-ray detector includes a plurality of pixel electrodes formed under a photoconductor layer and a signal processing unit for processing electric signals output from the pixel electrodes. According to related technologies, because a photoconductor layer is formed on application-specific integrated circuits (ASICs) in order to manufacture a large-scale direct type X-ray detector, an image is not detected in a seam area due to a seam between the ASICs when the ASICs having the photoconductor layer thereon are tiled in a large-scale. Specifically, during the tiling of ASICs, a seam having a size of at least 100 μm may be generated, thus tissues existing within the seam may not be detected.

When a large-scale X-ray detector is fabricated by tiling ASICs and a through hole formation process in the ASIC is performed on a wafer that completed a back end of line (BEOL) process, a hole with a depth of several hundreds of micrometers is formed on the wafer to contact a metal pad, an inner wall of the hole is insulated by an insulation film, and the hole is filled with a conductive metal. To perform the process, expensive equipment that is not generally used for a silicon process is employed. The process is performed at high temperature that may damage the ASIC. Also, it is difficult to form the hole in the ASIC corresponding to the position of an upper electrode.

SUMMARY

Example embodiments may include large-scale X-ray detectors in which a pin pad on an upper surface of a chip is wire bonded to a lower surface of the chip utilizing gaps between tiled chips.

According to example embodiments, an X-ray detector includes a plurality of chips arranged on a printed circuit board, each of the plurality of chips comprising a plurality of pixel pads formed on a center portion of the printed circuit board and a plurality of pin pads surrounding the plurality of pixel pads, a plurality of pixel electrodes arranged above the plurality of chips corresponding to the plurality of chips, a redistribution layer electrically connecting the plurality of pixel electrodes and the plurality of pixel pads, a plurality of first electrode pads formed on a surface opposite to a surface of the plurality of chips where the plurality of pin pads are formed, a wire electrically connecting the plurality of first electrode pads and the plurality of pin pads, a photoconductor formed on the plurality of pixel electrodes, and a common electrode formed on the photoconductor.

The plurality of pin pads may be electrically connected to a plurality of second electrode pads formed on the redistribution layer and the wire may connect the first electrode pads and the second electrode pads in a gap between the plurality of chips. An area covered by the plurality of pixel electrodes may be larger than an area covered by the plurality of pixel pads. The redistribution layer may include at least one vertical wiring and at least one horizontal wiring that is connected to the vertical wiring. The plurality of second electrode pads may include an extended portion that extends outwardly to be exposed from a corresponding one of the plurality of the chips. The X-ray detector may further include a plurality of second bumps between the plurality of second electrode pads and the plurality of pin pads. The plurality of second bumps may electrically connect the plurality of second electrodes pads and the plurality of pin pads.

The X-ray detector may further include a plurality of first bumps between the printed circuit board and the plurality, of first electrode pads. The plurality of first bumps may electrically connect the printed circuit board and the plurality of first electrode pads. The redistribution layer may include a first substrate formed under the plurality of pixel electrodes, and an insulation layer formed under the first substrate. The first substrate may include a first vertical wiring connected to each of the plurality of pixel electrodes, the insulation layer may include a second vertical wiring connected to each of the plurality of pixel pads, and the first vertical wiring and the second vertical wiring may be electrically connected via a horizontal wiring provided between the first and second vertical wirings.

The X-ray detector may further include resin between the printed circuit board and the chips. The photoconductor may be formed of at least one material selected from the group consisting of amorphous selenium (a-Se), HgI2, PbI2, CdTe, CdZnTe, and PbO. According to example embodiments including a large-scale X-ray detector, because wire bonding is performed using a gap between the chips without penetrating the chips for a connection from the pin pads of the chip to a lower portion of the chip, a large-scale X-ray detector may be easily embodied. Because electric charges generated on the photoconductor in a seam area between the chip areas are transmitted to the chip via the pixel electrodes thereunder, an image of a seamless photography area may be accurately reproduced.

According to at least one example embodiment, an X-ray detector, includes a plurality of chips each including a plurality of pin pads; a plurality of first electrode pads on an opposite side of the plurality of chips from the plurality of pin pads and at least one wire configured to electrically connect the plurality of first electrode pads to the plurality of pin pads.

BRIEF DESCRIPTION OF THE DRAWINGS

Example embodiments will be more clearly understood from the following brief description taken in conjunction with the accompanying drawings.

FIG. 1 is a schematic cross-sectional diagram illustrating large-scale X-ray detectors according to example embodiments;

FIG. 2 is a plan view illustrating a chip of FIG. 1;

FIG. 3 is a cross-sectional diagram illustrating a part of a substrate of FIG. 1 according to other example embodiments; and FIG. 4 is a schematic conceptual diagram illustrating redistribution layers that electrically connect a pixel electrode and a chip in a large-scale X-ray detector according to example embodiments.

Figure 1:
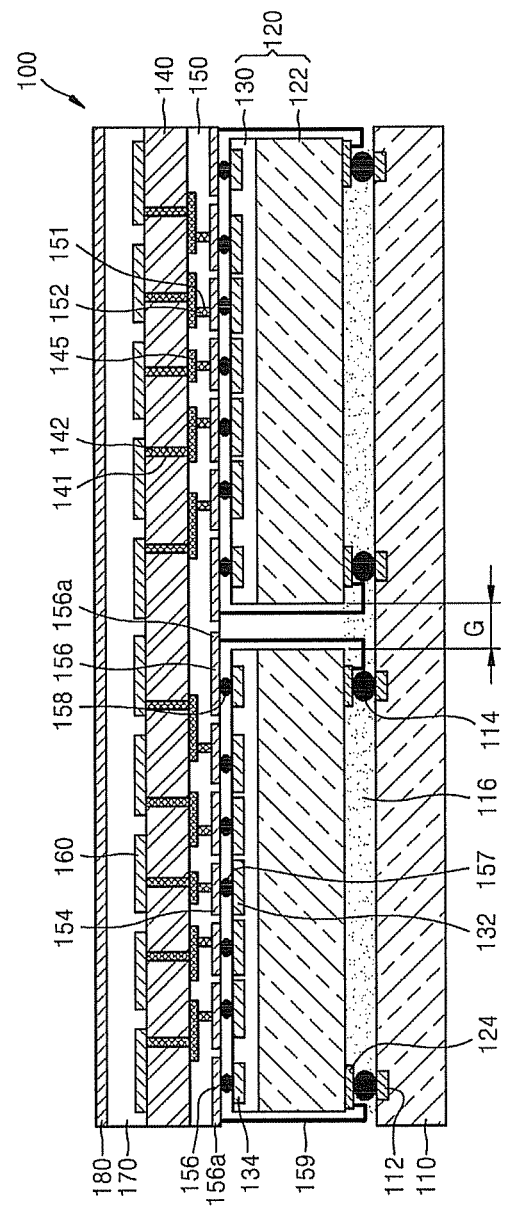
FIGS. 1-4 represent non-limiting, example embodiments as described herein.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments will now be described more fully with reference to the accompanying drawings, in which example embodiments are shown. Example embodiments may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a schematic cross-sectional diagram illustrating large-scale X-ray detectors 100 according to example embodiments. Referring to FIG. 1, a large-scale X-ray detector 100 may include a plurality of chips 120 on a printed circuit board 110, a plurality of pixel electrodes 160 above the chips 120, a photoconductor 170 covering the pixel electrodes 160, and a common electrode 180 on the photoconductor 170. A redistribution layer may be arranged between the pixel electrodes 160 and the chips 120 to electrically connect the pixel electrodes 160 and the chips 120. The chips 120 may be, for example, application-specific integrated circuits (ASICs) and/or CMOS chips. A gap G may be between the chips 120.

Figure 2:
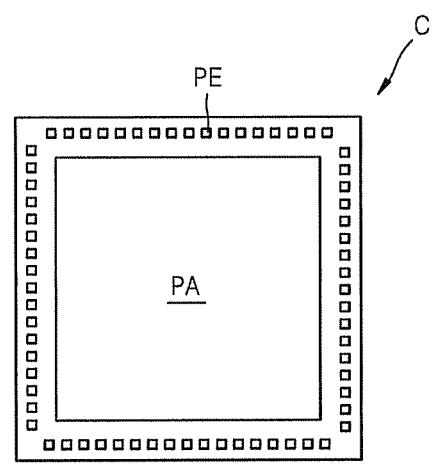

FIG. 2 is a plan view of one of the chips 120 of FIG. 1. Referring to FIGS. 1 and 2, a plurality of pixel pads (see 132 of FIG. 1) and a plurality of pin pads PE (see 134 of FIG. 1) may surround the pixel pads 132. The pixel pads 132 and the pin pads PE may be electrically connected by a wiring (not shown). The pixel pads 132 may be together illustrated as a pixel area PA. The pixel pads 132 corresponding to the pixel electrodes 160 may be connected to each other by wirings of a redistribution layer.

In FIG. 1, for convenience of explanation, only two chips 120 may be illustrated and five pixel pads 132 are illustrated for each of the chips 120. The pin pads 134 may be arranged with a same number as the pixel pads 132. Only two pin pads 134 may be illustrated in FIG. 1 for illustrative convenience. Each chip 120 may include a silicon substrate 122, an insulation layer 130 on the silicon substrate 122, the pixel pads 132 may be arranged on the central portion of the insulation layer 130, and the pin pads 134 may surround the pixel pads 132 along the edge of the insulation layer 130. Each of the pixel pads 132 may be connected to one of the pin pads 134 by wirings (not shown). The pixel pads 132 and the pin pads 134 may be exposed from a surface of the insulation layer 130.

A plurality of first electrode pads 124 may be under each of the chips 120. The first electrode pads 124 may be on a surface of each chip 120 facing and corresponding to the pin pads 134. A bump 114 may be between each of the first electrode pads 124 and a contact 112 of the printed circuit board 110, and may electrically connect the first electrode pads 124 and the contact 112. Resin 116, for example, epoxy resin, may be between the printed circuit board 110 and the chips 120 to fix the printed circuit board 110 to the chips 120. The redistribution layer may include a first substrate 140 and an insulation layer 150 on a lower surface of the first substrate 140. The first substrate 140 may be under the pixel electrodes 160. The first substrate 140 may be, for example, a silicon substrate. A through hole 141 may be in the first substrate 140 corresponding to each of the pixel electrodes 160. A first contact 142 filled with conductive metal may be in the through hole 141. The first contact 142 may be, for example, copper and/or aluminium. The first contact 142 may be referred to as a first vertical wiring.

Figure 3:
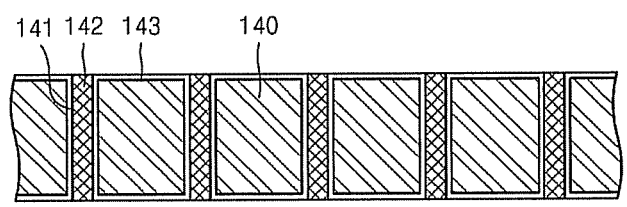

FIG. 3 is a cross-sectional diagram illustrating a part of a first substrate 140 of FIG. 1 according to other example embodiments. Referring to FIG. 3, when a silicon substrate is used as the first substrate 140, a silicon oxide layer 143 may be formed by oxidizing the silicon substrate and the silicon oxide layer 143 may be on surfaces of the first substrate 140, for example, including surfaces of the first substrate 140 in the through hole 141. The first contact 142 may be on the silicon oxide layer 143 in the through hole 141. Referring to FIG. 1, a through hole 151 may be in the insulation layer 150 corresponding to the through hole 141. A second contact 152 including, for example, conductive metal may be in the through hole 151. The second contact 152 may be of the same material as the first contact 142. The first contact 142 and the second contact 152 may be referred to as a first vertical wiring and a second vertical wiring, respectively.

A horizontal wiring 145 may be between the first contact 142 and the second contact 152 to connect the first contact 142 and the second contact 152. A second electrode pad 154 may be under the second contact 152. A second electrode pad 154 may correspond to each of the pixel pads 132 such that there is a second electrode pad 154 for each of the pixel pads 132. A second electrode pad 154 and a pixel pad 132 may be electrically connected to each other via a bump 157 that may be between the second electrode pad 154 and each pixel pad 132. A third electrode pad 156 surrounding the second electrode pad 154 may be on a lower surface of the insulation layer 150. A third electrode pad 156 may correspond to each of the pin pads 134 such that there is a third electrode pad 156 for each of the pin pads 134. The third electrode pad 156 may include an extended portion 156a that extends outwardly to be outside the chip 120.

The extended portion 156a of the third electrode pad 156 and the first electrode pad 124 may be bonded by a wire 159. Each pixel electrode 160 may be electrically connected to a first electrode pad 124 via the first contact 142, the horizontal wiring 145, the second contact 152, the second electrode pad 154, the bump 157, each pixel pad 132, the wiring between each pixel pad 132 and each pin pad 134, each pin pad 134, the bump 158, the third electrode pad 156, and the wire 159. The wire 159 may be connected to each first electrode pad 124 and the third electrode pad 156 in the gap G between the chips 120. A subsequent process for electrically connecting each pin pad 134 and the first electrode pad 124 by penetrating the substrate 122 and the insulation layer 130, may be omitted due to the above wire bonding using the wire 159.

Although at least one example embodiment described herein is illustrated as including only one insulation layer 150 on the first substrate 140, example embodiments are not limited thereto. For example, another horizontal wiring (not shown) may be on the insulation layer 150, another insulation layer (not shown) covering the horizontal wiring may be on the insulation layer 150, and another vertical wiring (not shown) connected to the other horizontal wirings may be in the other insulation layer.

Figure 4:
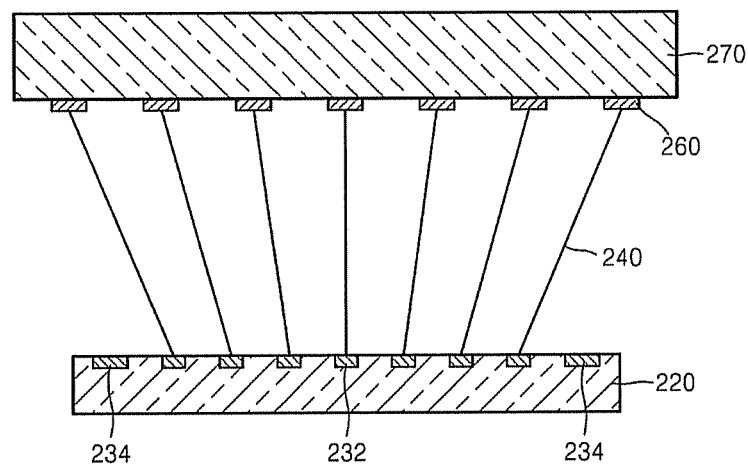

FIG. 4 is a schematic conceptual diagram illustrating a redistribution layer electrically connecting a pixel electrode and a chip in a large-scale X-ray detector according to example embodiments. In FIG. 4, a single chip 220 and a plurality of pixel electrodes 260 corresponding to the chip 220 may be illustrated for convenience of explanation. Referring to FIG. 4, a plurality of pixel pads 232 arranged on the center portion of the chip 220 and a plurality of pin pads 234 arranged corresponding to the pixel pads 232 and surrounded by the pixel pads 232 may be in the chip 220. An area taken by the pixel pads 232 of the chip 220 may be smaller than an area taken by the pixel electrodes 260 corresponding thereto. Thus, as illustrated in FIG. 4, in order to use all of an X-ray incident area of a photoconductor 270, an inclined connection wiring 240 may be needed to connect the pixel electrodes 260 and the pixel pads 232. Because a manufacturing process of the inclined connection wiring 240 may be difficult, a redistribution layer including a vertical wiring and a horizontal wiring may be used according to example embodiments.

Referring to FIG. 1, the redistribution layer may be a layer that connects the pixel electrodes 160 and the pixel pads 132. Because the pixel electrodes 160 corresponding to the pixel pads 132 arranged at the center portion of the chip 120 may be uniformly distributed in a larger area than the pixel pads 132 corresponding thereto, the redistribution layer may include first and second vertical wirings 142 and 152 and the horizontal wiring 145 so as to facilitate the connection between the pixel electrodes 160 and the pixel pads 132. In a printed circuit board 110, an input electric signal may be realized as an image signal by measuring a degree of transmission of an X-ray of an object to be measured. An electric signal output from the pixel electrodes 160 may be provided as necessary information to the printed circuit board 110 via the chip 120.

An X-ray detecting unit including a photoconductor 170 may be on the redistribution layer. The photoconductor 170 may be on the substrate 140 covering the pixel electrodes 160. The photoconductor 170 may be a single material layer. The photoconductor 170 may be, for example, amorphous selenium (a-Se), $HgI_2$, $PbI_2$, CdTe, CdZnTe and/or PbO. A thickness of the photoconductor 170 may vary according to an object to be measured. For example, when a photoconductor material is HgI$_2$, the thickness of the photoconductor 170 may be 500-600 μm when a chest is measured and 300-400 μm when a breast is measured. When a photoconductor material is a-Se, the thickness of the photoconductor 170 may be 900-1000 μm when a chest is measured and 300-400 μm when a breast is measured.

The photoconductor 170 may generate electric charges according to the intensity of an X-ray incident from an upper surface thereof. The photoconductor 170 may be divided into a plurality of seamless pixel areas. The pixel electrodes 160 may be under each of the pixel areas. The X-ray incident on the photoconductor 170 may be converted to electric charges in each pixel area, gathered in the corresponding pixel electrode 160 and converted to electric signals. The continuous common electrode 180 may be above the photoconductor 170. The common electrode 180 may be, for example, indium tin oxide and/or metal (e.g., aluminium and/or copper).

An electric field may be induced in the photoconductor 170 according to a DC voltage applied to the common electrode 180. Electrons and/or holes of hole-electron pairs generated in the photoconductor 170 may be moved to each pixel electrode 160. Moving electric charges in the photoconductor 170 may be determined according to a material of the photoconductor 170. A positive voltage or a negative voltage may be applied to the common electrode 180. Because an X-ray detector 100 of FIG. 1 may diffuse the area of the pixel pads 132 on the chip 120 to the area of the pixel electrode 160 corresponding thereto using the redistribution layer, an X-ray may be detected in the entire area of the photoconductor 170. A seamless image of a photographed area may be accurately produced.

According to one or more example embodiments, because wire bonding may be used for connection from a pin pad of a chip to a lower portion of the chip, without penetrating the chip, a large-scale X-ray detector may be easily embodied.

While example embodiments have been particularly shown and described, it will be understood by one of ordinary skill in the art that variations in form and detail may be made therein without departing from the spirit and scope of the claims.

What is claimed is:

1. An X-ray detector, comprising:
a plurality of chips each of the plurality of chips including a plurality of pixel pads on an upper surface thereof, a plurality of pin pads surrounding the plurality of pixel pads on the upper surface thereof, and a plurality of first electrode pads on a lower surface thereof to correspond to the plurality of pin pads, each of the plurality of pin pads being electrically connected to a corresponding one of the plurality of pixel pads;
a plurality of pixel electrodes on an upper surface of a redistribution layer, the redistribution layer on the upper surface of each of the plurality of chips, at least one of the plurality of pixel electrodes associated with each of the plurality of chips being at least partially between two or more of the plurality of chips;
a plurality of second electrode pads on a lower surface of the redistribution layer to correspond to the plurality of pixel pads;
a plurality of third electrode pads on the lower surface of the redistribution layer, the plurality of third electrodes electrically connected to the corresponding plurality of pin pads, each of the plurality of third electrode pads having an extension portion extending across an end of at least one of the plurality of chips to correspond with the plurality of first electrodes; and
a plurality of wires electrically connecting the extension portion of the plurality of third electrode pads and the corresponding first electrode pad.

2. The X-ray detector of claim 1, further comprising:
a photoconductor on the plurality of pixel electrodes; and
a common electrode on the photoconductor,
wherein the redistribution layer is configured to electrically connect the plurality of pixel electrodes to the plurality of pixel pads.

3. The X-ray detector of claim 2, wherein the photoconductor is at least one of amorphous selenium (a-Se), HgI$_2$, PbI$_2$, CdTe, CdZnTe and PbO.

4. The X-ray detector of claim 1, wherein at least one of the plurality of wires is between two or more of the plurality of chips.

5. The X-ray detector of claim 4, wherein each of the plurality of wires is a bond wire.

6. The X-ray detector of claim 1, wherein an area covered by the plurality of pixel electrodes is greater than an area covered by the plurality of pixel pads.

7. The X-ray detector of claim 6, wherein the redistribution layer includes at least one vertical wiring and at least one horizontal wiring, the at least one horizontal wiring connected to the at least one vertical wiring.

8. The X-ray detector of claim 1, further comprising:
a plurality of bumps between the plurality of third electrode pads and the plurality of pin pads.

9. The X-ray detector of claim 1, further comprising:
a printed circuit board; and
a plurality of bumps between the printed circuit board and the plurality of first electrode pads.

10. The X-ray detector of claim 9, further comprising:
resin between the printed circuit board and the plurality of chips.

11. The X-ray detector of claim 1, further comprising:
a printed circuit board,
wherein the plurality of pixel electrodes are connected to the printed circuit board, and
the plurality of pixel electrodes are not connected to the printed circuit board by conductors passing through the plurality of chips.

12. The X-ray detector of claim 1, wherein the redistribution layer includes a substrate between the plurality of pixel electrodes and the plurality of chips, and a first insulation layer between the substrate and the plurality of chips,
the substrate includes at least one first vertical wiring connected to the plurality of pixel electrodes,
the first insulation layer includes at least one second vertical wiring connected to the plurality of pixel pads, and
a horizontal wiring is connected to the at least one first vertical wiring and the at least one second vertical wiring.

13. The X-ray detector of claim 12, wherein the redistribution layer includes a second insulation layer between the substrate and the plurality of chips, and
the second insulation layer includes at least one third vertical wiring.

14. The X-ray detector of claim 1, further comprising:
a printed circuit board,
wherein a conductive line is connected to at least one of the plurality of pixel electrodes and the printed circuit board, the conductive line passing into and out of the redistribution layer twice.

15. The X-ray detector of claim 1, wherein the plurality of chips are at least one of application-specific integrated circuits (ASIC) and complementary metal-oxide-semiconductor (CMOS) chips.

16. The X-ray detector of claim 1,
wherein the redistribution layer is configured to electrically connect the plurality of pixel electrodes to the plurality of chips, and the X-ray detector further comprises:
a printed circuit board connected to the first electrode pads,
wherein a conductive line is connected to at least one of the plurality of pixel electrodes and the printed circuit board, the conductive line passing into and out of the redistribution layer at least twice.

17. The X-ray detector of claim 1, wherein each of the plurality of wires is a bond wire.

* * * * *